United States Patent
Liu et al.

(10) Patent No.: US 7,872,823 B2
(45) Date of Patent: Jan. 18, 2011

(54) AGC LOOP WITH WEIGHTED ZERO FORCING AND LMS ERROR SOURCES AND METHODS FOR USING SUCH

(75) Inventors: Jingfeng Liu, Longmont, CO (US);
Hongwei Song, Longmont, CO (US);
Jongseung Park, Allentown, PA (US);
George Mathew, San Jose, CA (US);
Yuan Xing Lee, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 201 days.

(21) Appl. No.: 12/352,540

(22) Filed: Jan. 12, 2009

(65) Prior Publication Data

US 2010/0177419 A1 Jul. 15, 2010

(51) Int. Cl.
*G11B 5/09* (2006.01)
(52) U.S. Cl. ...................................................... 360/39
(58) Field of Classification Search .................. 360/39, 360/32, 46; 375/233, 350; 714/736; 341/118; 342/372; 398/183, 209; 369/53.17
See application file for complete search history.

(56) References Cited

U.S. PATENT DOCUMENTS

| | | | | |
|---|---|---|---|---|
| 5,952,965 A | * | 9/1999 | Kowalski | 342/372 |
| 6,000,052 A | * | 12/1999 | Fredrickson | 714/736 |
| 6,690,310 B1 | * | 2/2004 | Upton | 341/118 |
| 7,215,972 B2 | * | 5/2007 | Premakanthan et al. | 455/522 |
| 7,436,882 B2 | * | 10/2008 | Momtaz | 375/233 |
| 7,443,913 B2 | * | 10/2008 | Bhakta et al. | 375/233 |
| 7,522,847 B2 | * | 4/2009 | Momtaz et al. | 398/209 |
| 7,630,650 B2 | * | 12/2009 | Hoshida et al. | 398/183 |
| 7,768,730 B2 | * | 8/2010 | Bliss et al. | 360/32 |
| 2005/0135471 A1 | * | 6/2005 | Tonietto et al. | 375/233 |
| 2007/0110199 A1 | * | 5/2007 | Momtaz et al. | 375/350 |
| 2010/0074078 A1 | * | 3/2010 | Cao et al. | 369/53.17 |

* cited by examiner

*Primary Examiner*—Fred Tzeng
(74) *Attorney, Agent, or Firm*—Hamilton, DeSanctis & Cha (LSI)

(57) ABSTRACT

Various embodiments of the present invention provide systems and methods for gain control. For example, some embodiments of the present invention provide variable gain control circuits. Such circuits include a zero forcing loop generating a zero forcing feedback and a least mean square loop generating a least mean square feedback. An error quantization circuit generates a hybrid feedback based upon a threshold condition using the zero forcing feedback and the least mean square feedback. A variable gain amplifier is at least in part controlled by a derivative of the hybrid feedback.

20 Claims, 4 Drawing Sheets

AGC LOOP WITH WEIGHTED ZERO FORCING AND LMS ERROR SOURCES AND METHODS FOR USING SUCH

BACKGROUND OF THE INVENTION

The present inventions are related to systems and methods for performing gain control, and more particularly to systems and methods for performing automatic gain control across a broad spectrum of operating conditions.

A typical storage device includes a magnetic storage medium that includes magnetically represented information stored thereon. A head is disposed in relation to the storage medium that senses the magnetically represented information and provides an electrical signal representing the information. This electrical signal is ultimately passed to a data detection circuit that performs one or more data detection processes in order to recover the information originally written to the storage medium. The signal derived from the magnetic storage medium is provided to an automatic gain control circuit. Such automatic gain control circuits may be implemented, for example, using a zero forcing approach. In other cases, an automatic gain control circuit may be implemented using a least mean square approach. Both approaches exhibit limitations depending upon the input signal that is to be controlled.

Hence, for at least the aforementioned reasons, there exists a need in the art for advanced systems and methods for performing gain control.

BRIEF SUMMARY OF THE INVENTION

The present inventions are related to systems and methods for performing gain control, and more particularly to systems and methods for performing automatic gain control across a broad spectrum of operating conditions.

Some embodiments of the present invention provide variable gain control circuits. Such circuits include a zero forcing loop generating a zero forcing feedback and a least mean square loop generating a least mean square feedback. An error quantization circuit generates a hybrid feedback based upon a threshold condition using the zero forcing feedback and the least mean square feedback. A variable gain amplifier is at least in part controlled by a derivative of the hybrid feedback. In some instances of the aforementioned embodiments, the zero forcing loop includes: an analog to digital converter providing a series of digital samples based upon an output of the variable gain amplifier; an equalizer circuit equalizing the series of digital samples and providing an equalized output; a data detector circuit operable to perform a data detection process on the equalized output and to provide a detected output; a convolution circuit operable to reconstruct the equalized output based upon the detected output and to provide a convolved output; an adder circuit subtracting the convolved output from a derivative of the equalized output to create an error signal; and a multiplier circuit multiplying the error signal by the convolved output create the zero forcing feedback. In various instances of the aforementioned embodiments, the least mean square loop includes: an analog to digital converter providing a series of digital samples based upon an output of the variable gain amplifier; an equalizer circuit equalizing the series of digital samples and providing an equalized output; a data detector circuit operable to perform a data detection process on the equalized output and to provide a detected output; a convolution circuit operable to reconstruct the equalized output based upon the detected output and to provide a convolved output; an adder circuit subtracting the convolved output from a derivative of the equalized output to create an error signal; and a multiplier circuit multiplying the error signal by a derivative of the series of digital samples to create the least mean square feedback.

In various instances of the aforementioned embodiments, the threshold condition is a single energy threshold. In such instances when the energy level of the partial response exceeds the single energy threshold, the error quantization circuit provides the least mean square feedback is selected as the hybrid feedback. In contrast, when the energy level is less than the single energy threshold, the error quantization circuit provides the zero forcing feedback is selected as the hybrid feedback.

In other instances of the aforementioned embodiments, the threshold condition exhibits a first energy threshold and a second energy threshold. In such instances, when an energy level (e.g., energy of the target) exceeds the first energy threshold, the error quantization circuit provides the least mean square feedback is selected as the hybrid feedback. When the energy level is less than the second energy threshold, the error quantization circuit provides the zero forcing feedback is selected as the hybrid feedback. When the energy level is between the first energy threshold and the second energy threshold, the error quantization circuit provides a combination of the zero forcing feedback and the least mean square feedback as the hybrid feedback.

In yet other instances of the aforementioned embodiments, the threshold condition exhibits a first energy threshold, a second energy threshold, a third energy threshold and a fourth energy threshold. In such instances, when an energy level exceeds the first energy threshold, the error quantization circuit provides the least mean square feedback is selected as the hybrid feedback. When the energy level is between the first energy threshold and the second energy threshold, the error quantization circuit provides a first combination of the zero forcing feedback and the least mean square feedback as the hybrid feedback. When the energy level is between the second energy threshold and the third energy threshold, the error quantization circuit provides a second combination of the zero forcing feedback and the least mean square feedback as the hybrid feedback. When the energy level is between the third energy threshold and the fourth energy threshold, the error quantization circuit provides a third combination of the zero forcing feedback and the least mean square feedback as the hybrid feedback. When the energy level is less than the fourth energy threshold, the error quantization circuit provides the zero forcing feedback is selected as the hybrid feedback.

In one particular case, the aforementioned first combination of the zero forcing feedback and the least mean square feedback is calculated in accordance with the following equation:

$$0.75(\text{zero forcing feedback}) + 0.25(\text{least mean square feedback}).$$

The second combination of the zero forcing feedback and the least mean square feedback is calculated in accordance with the following equation:

$$0.50(\text{zero forcing feedback}) + 0.50(\text{least mean square feedback}); \text{ and}$$

The third combination of the zero forcing feedback and the least mean square feedback is calculated in accordance with the following equation:

$$0.25(\text{zero forcing feedback}) + 0.75(\text{least mean square feedback}).$$

Other embodiments of the present invention provide methods for performing automatic gain control. Such methods include performing a variable gain amplification on an input signal to provide a gain adjusted input signal; performing a zero forcing feedback on the gain adjusted input signal to create a zero forcing feedback; performing a least mean square feedback on the gain adjusted signal to create a least mean square feedback; determining an energy level associated with the zero forcing feedback and the least mean square feedback; generating a hybrid feedback based upon a threshold condition using the zero forcing feedback and the least mean square feedback; and modifying a gain of the variable gain amplification based on the hybrid feedback.

Yet further embodiments of the present invention provide storage devices that include a magnetic storage medium including magnetically recorded information, a variable gain amplifier receiving an analog input signal representing the magnetically recorded information and providing a gain adjusted output, an analog to digital converter providing a series of digital samples corresponding to the gain adjusted output, a zero forcing loop generating a zero forcing feedback, and a least mean square loop generating a least mean square feedback. An error quantization circuit generates a hybrid feedback based upon a threshold condition using the zero forcing feedback and the least mean square feedback, and a derivative of the hybrid feedback controls a gain of the variable gain amplifier.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for performing gain control, and more particularly to systems and methods for performing automatic gain control across a broad spectrum of operating conditions.

Figure 1:
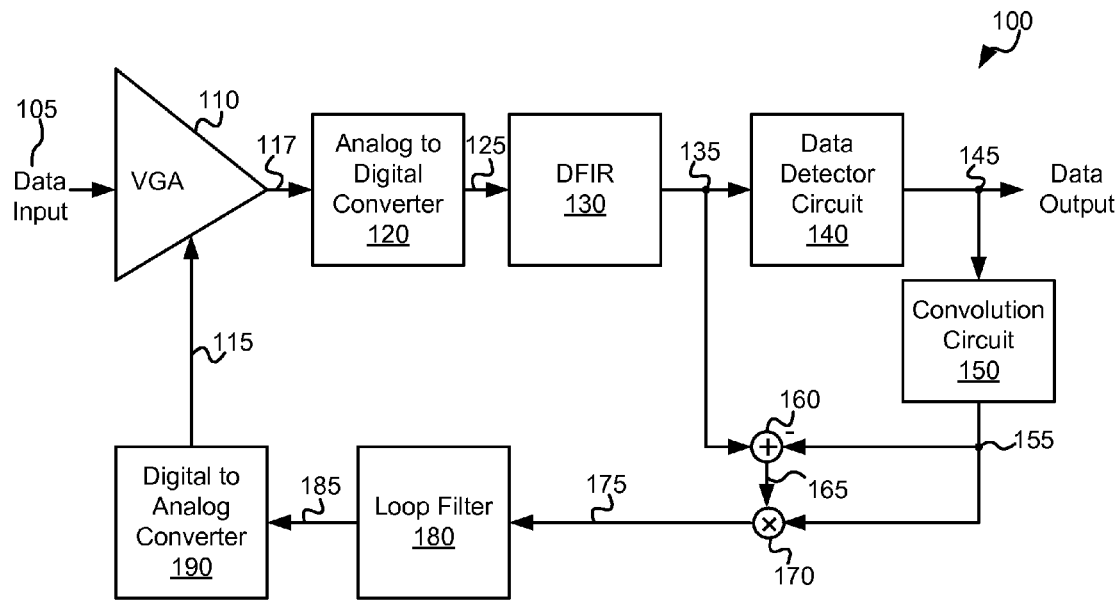
FIG. 1 depicts a prior art zero forcing based gain control loop circuit.

Turning to FIG. 1, a prior art zero forcing based gain control loop circuit 100 is depicted. Zero forcing based gain control loop circuit 100 includes a variable gain amplifier 110 that receives an analog data input signal 105 and provides a gain adjusted output 117. The applied gain varies based upon an analog feedback signal 115. Gain adjusted output 117 is provided to an analog to digital converter circuit 120 that converts the analog input into a series of digital samples 125. Digital samples 125 are provided to a digital finite impulse response filter 130 that equalizes the digital samples and provides an equalized output 135.

Equalized output 135 is provided to a data detector circuit 140 that performs a defined data detection process on the received series of samples and provides a data output 145. Data output 145 is provided to a convolution circuit 150 that operates to reconstruct equalized output 135 from data output 145 using the same partial response target used by data detection circuit 140. Convolution circuit 150 provides a convolved output 155. Convolved output 155 is subtracted from equalized output 135 using an adder circuit 160. The resulting difference is an error signal 165. It is expected that the data detection process will result a reduction in the number of errors exhibited in data output 145 in comparison with the number of errors exhibits in equalized output 135. Thus, where it is assumed that the number of errors in data output 145 is approximately zero, error signal 165 approximates the number of errors in equalized output 135.

Some of the errors represented by error signal 165 are a result of an improper gain of variable gain amplifier 110. Thus, error signal 165 may be used as the basis of analog feedback signal 115. In particular, error signal 165 is multiplied by convolved output 155 using a multiplier 170 to provide an adjusted error signal 175. Adjusted error signal 175 is filtered using a loop filter 180, and a filtered output 185 is provided to a digital to analog converter 190 that converts the digital signal to the analog domain. Analog feedback signal 115 is provided to variable gain amplifier 110 where it operates to modify the gain thereof. The loop operates to drive error signal 165 to zero, thereby, in theory, reducing the number of errors exhibited at equalized output 135. It has been determined, however, that for partial response targets with large Nyquist energy, such a zero forcing approach does not provide optimum performance. As an example, for a circuit using a three tap convolution filter for convolution circuit 150 having coefficients of 8, 14, 0, zero forcing based gain control loop circuit 100 does not provide optimum performance.

Figure 2:
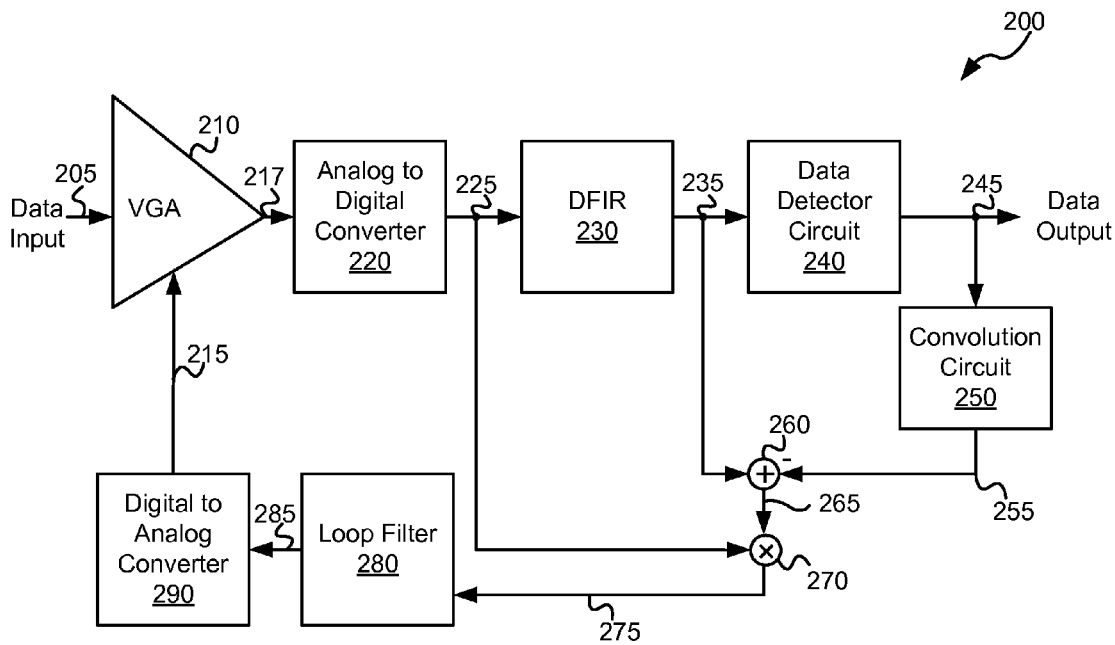
FIG. 2 depicts a prior art least mean square based gain control circuit.

Turning to FIG. 2, a prior art least mean square based gain control loop circuit 200 is depicted. Least mean square based gain control loop circuit 200 includes a variable gain amplifier 210 that receives an analog data input signal 205 and provides a gain adjusted output 217. The applied gain varies based upon an analog feedback signal 215. Gain adjusted output 217 is provided to an analog to digital converter circuit 220 that converts the analog input into a series of digital samples 225. Digital samples 225 are provided to a digital finite impulse response filter 230 that equalizes the digital samples and provides an equalized output 235.

Equalized output 235 is provided to a data detector circuit 240 that performs a defined data detection process on the received series of samples and provides a data output 245. Data output 245 is provided to a convolution circuit 250 that operates to reconstruct equalized output 235 from data output 245 using the same partial response target used by data detection circuit 240. Convolution circuit 250 provides a convolved output 255. Convolved output 255 is subtracted from equalized output 235 using an adder circuit 260. The resulting difference is an error signal 265. It is expected that the data detection process will result in a reduction in the number of errors exhibited in data output 245 in comparison with the number of errors exhibits in equalized output 235. Thus, where it is assumed that the number of errors in data output 245 is approximately zero, error signal 265 approximates the number of errors in equalized output 235.

Some of the errors represented by error signal 265 are a result of an improper gain of variable gain amplifier 210. Thus, error signal 265 may be used as the basis of analog feedback signal 215. In particular, error signal 265 is multiplied by digital samples 225 using a multiplier 170 to provide an adjusted error signal 175. Adjusted error signal 175 is filtered using a loop filter 180, and a filtered output 185 is provided to a digital to analog converter 190 that converts the digital signal to the analog domain. Analog feedback signal 115 is provided to variable gain amplifier 110 where it operates to modify the gain thereof. The loop operates to drive error signal 165 to zero, thereby, in theory, reducing the number of errors exhibited at equalized output 135. It has been determined, however, that for partial response targets with little or no Nyquist energy, using a least mean square approach to provide feedback to variable gain amplifier 210 will interact with a finite impulse response adaptation loop including digital finite impulse response filter 230. This interaction reduces any control that can be achieved over the automatic gain control loop. Further, for partial response targets with little or no Nyquist energy, such a least mean square approach does not provide optimum performance. As an example, for a circuit using a three tap convolution filter for convolution circuit 250 having coefficients of 8, 12, 2, least mean square based gain control loop circuit 200 does not provide optimum performance.

Figure 3:
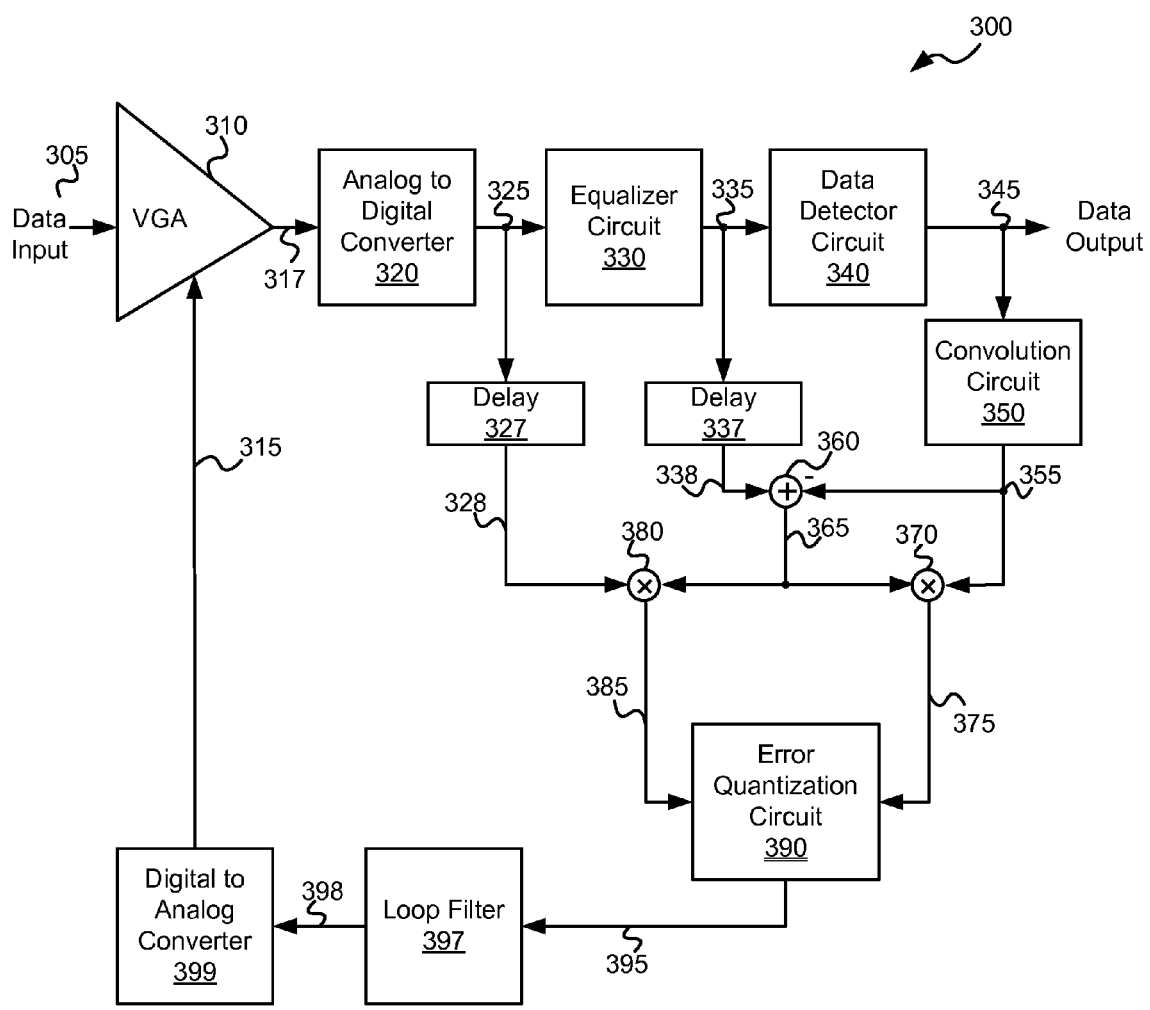
FIG. 3 depicts a hybrid automatic gain control loop in accordance with various embodiments of the present invention.

Turning to FIG. 3, a hybrid automatic gain control loop circuit 300 is shown in accordance with various embodiments of the present invention. Hybrid automatic gain control loop circuit 300 includes a variable gain amplifier 310 that receives an analog data input 305. In some cases, analog data input 305 is derived from a magnetic storage medium and is provided to variable gain amplifier 310 via some analog front end circuitry including, but not limited to, a continuous time filter. Based upon the disclosure provided herein, one of ordinary skill in the art will recognize a variety of sources of analog data input 305 that would be consistent with different embodiments of the present invention. Variable gain amplifier 310 may be any amplifier known in the art that is capable of receiving and amplifying an analog signal, with the gain being varied based upon a feedback signal. Based upon the disclosure provided herein, one of ordinary skill in the art will recognize a variety of implementations of variable gain amplifiers that may be used in relation to one or more embodiments of the present invention.

Variable gain amplifier 310 provides a gain adjusted output 317. The applied gain varies based upon an analog feedback signal 315. Gain adjusted output 317 is provided to an analog to digital converter circuit 320 that converts gain adjusted output 317 into a series of digital samples 325. Analog to digital converter 320 may be any circuit known in the art that is capable of receiving an analog input and converting it to a series of digital samples. Based upon the disclosure provided herein, one of ordinary skill in the art will recognize a variety of analog to digital converter circuits that may be used in relation to different embodiments of the present invention. Digital samples 325 are provided to an equalizer circuit 330 that equalizes digital samples 325 and provides an equalized output 335. In some embodiments of the present invention, equalizer circuit 330 is a finite impulse response filter having one or more taps. In one particular embodiment of the present invention, equalizer circuit 330 is a ten tap finite impulse response filter. Based upon the disclosure provided herein, one of ordinary skill in the art will recognize a variety of equalizer designs that may be used to implement equalizer circuit 330 in accordance with different embodiments of the present invention.

Equalized output 335 is provided to a data detector circuit 340 that performs a defined data detection and/or decode process on the received series of samples and provides a data output 345. Data detector circuit 340 may be any circuit known in the art for recovering original data from an input data stream by detecting and correcting errors in the data stream. In one particular embodiment of the present invention, data detector circuit 340 includes a low density parity check decoder circuit as are known in the art. Based upon the disclosure provided herein, one of ordinary skill in the art will recognize a variety of implementations of data detector circuit 340 that are possible in accordance with the various embodiments of the present invention.

Data output 345 is provided to a convolution circuit 350 that operates to reconstruct equalized output 335 from data output 345 using the same partial response target used by data detection circuit 340. Convolution circuit 350 provides a convolved output 355. In one particular embodiment of the present invention, convolution circuit 350 is a finite impulse response filter using the same partial response target as data detection circuit 340. In some cases, the finite impulse response filter is a three tap finite impulse response filter. Based upon the disclosure provided herein, one of ordinary skill in the art will recognize a variety of circuits that may be used to reconstruct equalized output 335 from data output 345 in accordance with different embodiments of the present invention.

Equalized output 335 is provided to a delay circuit 337 that in turn provides a delayed equalized output 338. Delayed equalized output 338 is the same as equalized output 325 except that it is delayed in time to align it with convolved output 355. Accordingly, delay circuit 337 causes a delay equal to the number of processing periods required by data detector circuit 340 and convolution circuit 350. Delayed equalizer output 338 and convolved output 355 are provided to an adder circuit 360 that subtracts convolved output 355 from delayed equalizer output 338 to produce an error signal 365. It is expected that the data detection process will result a reduction in the number of errors exhibited in data output 345 in comparison with the number of errors exhibits in equalized output 335. Thus, where it is assumed that the number of errors in data output 345 is approximately zero, error signal 365 approximates the number of errors in equalized output 335.

In addition, digital samples 325 are provided to a delay circuit 327 that in turn provides a delayed sample output 328. Delayed sample output 328 is the same as digital samples 325 except that it is delayed in time to align it with a convolved output 355. Accordingly, delay circuit 327 causes a delay equal to the number of processing periods required by equalizer circuit 330, data detector circuit 340 and convolution circuit 350. Some of the errors represented by error signal 365 are a result of an improper gain of variable gain amplifier 310. Thus, error signal 365 may be used as the basis of analog feedback signal 315.

Error signal 365 is used in both a least mean square loop and a zero forcing loop. In particular, error signal 365 is provided to a multiplier 370 where it is multiplied by convolved output 355. The resulting product is provided as a zero forcing feedback 375. In addition, error signal 365 is provided to a multiplier 380 where it is multiplied by delayed sample output 328. The resulting product is provides as a least mean square error signal 385. Both least mean square error signal 385 and zero forcing feedback 375 are provided to an error quantization circuit 390 that combines the error signals to generate a hybrid feedback 395.

In some embodiments of the present invention, determination of whether to use least mean square feedback 385 or zero forcing feedback 375 is based upon the Nyquist energy of the target. Determination of the Nyquist energy may be done where it is assumed that convolution circuit 350 is a three tap finite impulse response filter using the following equation:

Energy=$ABS$(TAP$_2$−(TAP$_1$+TAP$_3$)).

The three tap filter is the partial response target. Thus, for example, where convolution circuit 350 is implemented as a three tap finite impulse response filter with taps of [8, 14, 0], the energy would be twenty-two. As another example, where the taps are [8, 12, 2], the energy would be two.

In some embodiments of the present invention, a single energy threshold is used to determine whether least mean square feedback 385 or zero forcing feedback 375 is used as the basis of the feedback signal to variable gain amplifier 350. For example, where the Energy is calculated to be less than four, zero forcing feedback 375 is used. In contrast, for Energy values greater than or equal to four, least mean square feedback 385 is used. Based upon the disclosure provided herein, one of ordinary skill in the art will appreciate a particular threshold value that may be used to select between zero forcing feedback 375 and least mean square feedback 385 in accordance with different embodiments of the present invention.

In other embodiments of the present invention, multiple energy thresholds may be used to select between least mean square feedback 385 and zero forcing feedback 375, or some combination of least mean square feedback 385 and zero forcing feedback 375. For example, where the Energy is calculated to be less than three, zero forcing feedback 375 is used. In contrast, for Energy values greater than or equal to five, least mean square feedback 385 is used. For values greater than or equal to three and less than or equal to five, a combination of least mean square feedback 385 and zero forcing feedback 375 is used. Based upon the disclosure provided herein, one of ordinary skill in the art will appreciate various threshold values that may be used in accordance with different embodiments of the present invention and one or more combinations of zero forcing feedback 375 and least mean square feedback 385 that may be used in accordance with different embodiments of the present invention.

In one particular embodiment of the present invention, five thresholds are used. In particular, where the Energy is calculated to be greater than or equal to six, least mean square feedback 385 is used as the hybrid signal. For Energy values less than or equal to two, zero forcing feedback 375 is used as the hybrid signal. For Energy values equal to three, the following combination of zero forcing feedback 375 and least mean square feedback 385 is used:

Hybrid feedback=0.75(zero forcing feedback 375)+ 0.25(least mean square feedback 385).

For Energy values equal to four, the following combination of zero forcing feedback 375 and least mean square feedback 385 is used:

Hybrid feedback=0.50(zero forcing feedback 375)+ 0.50(least mean square feedback 385).

For Energy values equal to five, the following combination of zero forcing feedback 375 and least mean square feedback 385 is used:

Hybrid feedback=0.25(zero forcing feedback 375)+ 0.75(least mean square feedback 385).

Hybrid feedback 395 is provided to a loop filter 397 which limits the amount that hybrid feedback 395 can change during any period. Loop filter 397 provides a filter output 398 to a digital to analog converter 399. Loop filter 398 may be any digital filter known in the art that is capable of constraining hybrid feedback 395 to avoid the impact of any spurious noise in data input signal 305. Digital to analog converter 399 converts the received filter output 398 to analog feedback signal 315. Digital to analog converter 399 may be any circuit known in the art that is capable of converting a digital input into a corresponding analog signal.

Figure 4:
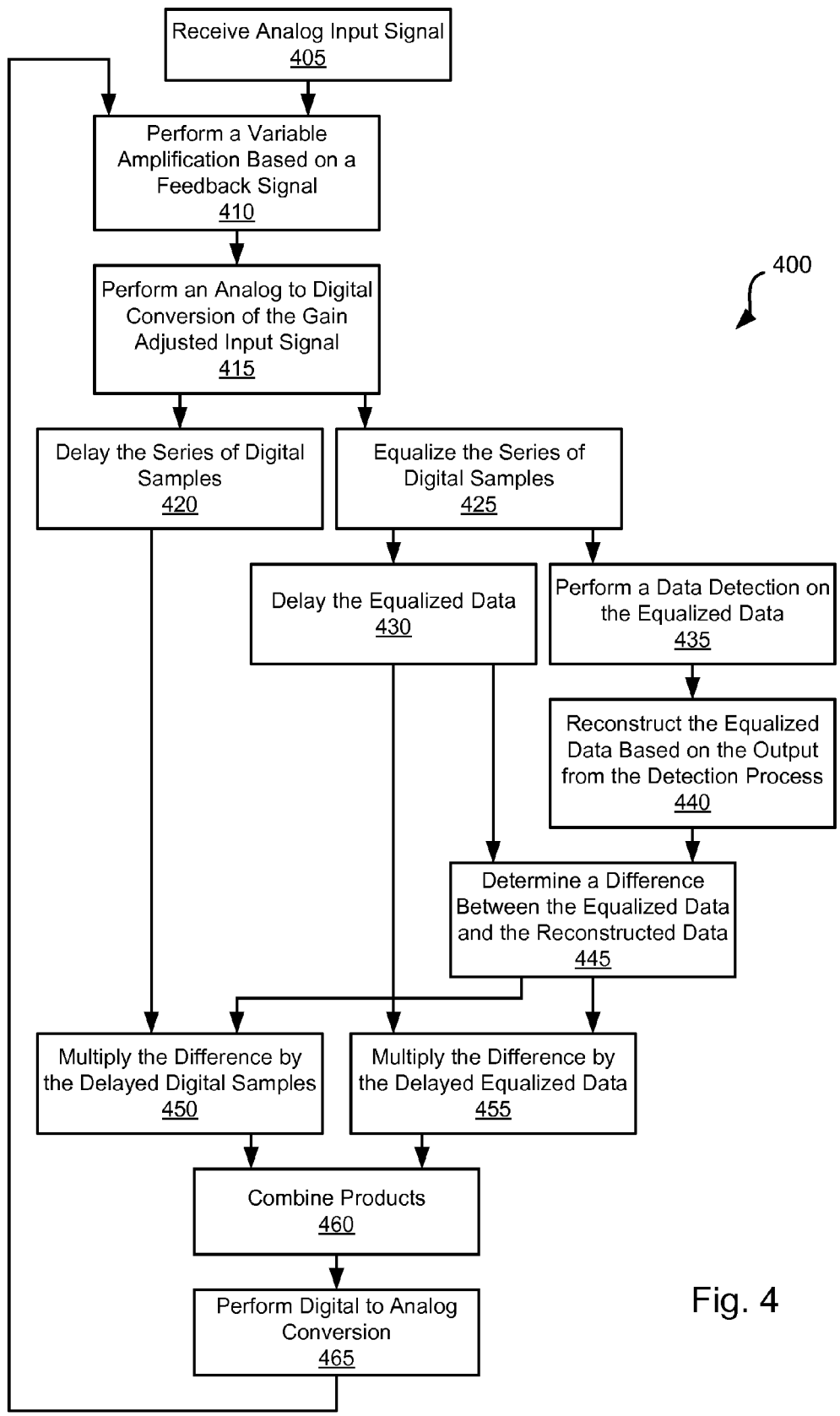
FIG. 4 is a flow diagram depicting a method in accordance with some embodiments of the present invention for providing hybrid automatic gain control to a received signal.

Turning to FIG. 4, a flow diagram 400 shows a method in accordance with some embodiments of the present invention for providing automatic gain control to a received signal. Following flow diagram 400, an analog input signal is received (block 405). In some cases, this analog input signal may be received from a read/write head disposed in relation to a magnetic storage medium that is sensing magnetic fields previously written to the magnetic storage medium. It should be noted that the analog input signal may be received from other sources. A variable amplification is applied to the received analog input signal (block 410). As more fully described below, the variable amplification is varied based upon a feedback signal that may be some combination of a zero forcing and a least mean square feedback. The amplified signal is then converted to a series of digital samples (block 415). This may be done, for example, by providing the amplified signal to an analog to digital converter circuit that repeatedly samples the analog input signal and provides the corresponding results as a series of digital samples.

The series of digital samples are then equalized (block 425). In one particular embodiment of the present invention, the equalization process is performed using a finite impulse response filter that includes a number of taps. In one particular case, the number of taps is ten. Based upon the disclosure provided herein, one of ordinary skill in the will recognize other approaches that may be used to perform the equalization in accordance with different embodiments of the present invention. A data detection process is then performed on the equalized data (block 435). The data detection process may be any process known in the art for detecting and/or correcting errors identified in the series of data samples. In some cases, such as in a low density parity check decoding process, the detection process relies on a previously applied, known encoding. Based upon the disclosure provided herein, one of ordinary skill in the art will recognize a variety of data detection processes that may be used in relation to different embodiments of the present invention.

The equalized output is then reconstructed using the output from the data detection process (block 440). Further, the original equalized output is delayed in time to align it with the reconstructed equalized output (block 430). This delay compensates for the time required by the data detection and reconstruction processes. The reconstructed equalized output is then subtracted from the delayed equalized output (block 445). The result of the subtraction is an error signal. It is expected that the data detection process will result a reduction in the number of errors exhibited in the data output in comparison with the number of errors exhibits in the equalized output. Thus, where it is assumed that the number of errors in the data output is approximately zero, the generated error signal approximates the number of errors in equalized output.

The original series of data samples provided by the analog to digital conversion process is delayed in time to align it with the error signal (block 420). This delay compensates for the time required by the data detection, reconstruction, and error calculation processes. The delayed series of data samples is multiplied by the error signal (block 450) to create a least mean square feedback. The delayed equalized data is also multiplied by the error signal (block 455) to create a zero forcing feedback. Both of the feedback products are combined to create a hybrid feedback product (block 460).

In some embodiments of the present invention, determination of whether to use least mean square feedback or zero forcing feedback is based upon an approximation of the Nyquist energy anticipated by the reconstruction process of block 440. Determination of the Nyquist energy may be done where it is assumed that the reconstruction process is done using a three three tap finite impulse response filter using the following equation:

$$\text{Energy} = ABS(TAP_2 - (TAP_1 + TAP_3)).$$

Thus, for example, where the reconstruction process is performed using a three tap finite impulse response filter with taps of [8, 14, 0], the energy would be twenty-two. As another example, where the taps are [8, 12, 2], the energy would be two.

In some embodiments of the present invention, a single energy threshold is used to determine whether least mean square feedback or zero forcing feedback is used as the basis of the feedback signal to the variable gain amplification process (block 410). For example, where the Energy is calculated to be less than four, zero forcing feedback is used. In contrast, for Energy values greater than or equal to four, least mean square feedback is used. Based upon the disclosure provided herein, one of ordinary skill in the art will appreciate a particular threshold value that may be used to select between zero forcing feedback and least mean square feedback in accordance with different embodiments of the present invention.

In other embodiments of the present invention, multiple energy thresholds may be used to select between least mean square feedback and zero forcing feedback, or some combination of least mean square feedback and zero forcing feedback. For example, where the Energy is calculated to be less than three, zero forcing feedback is used. For Energy values greater than or equal to five, least mean square feedback is used. For values greater than or equal to three and less than five, a combination of least mean square feedback and zero forcing feedback is used. Based upon the disclosure provided herein, one of ordinary skill in the art will appreciate various threshold values that may be used in accordance with different embodiments of the present invention and one or more combinations of zero forcing feedback and least mean square feedback that may be used in accordance with different embodiments of the present invention.

In one particular embodiment of the present invention, five thresholds are used. In particular, where the Energy is calculated to be greater than or equal to six, least mean square feedback is used. For Energy values less than or equal to two, zero forcing feedback is used. For Energy values equal to three, the following combination of zero forcing feedback and least mean square feedback is used:

Hybrid feedback=0.75(zero forcing feedback)+0.25 (least mean square feedback).

For Energy values equal to four, the following combination of zero forcing feedback and least mean square feedback is used:

Hybrid feedback=0.50(zero forcing feedback)+0.50 (least mean square feedback).

For Energy values equal to five, the following combination of zero forcing feedback and least mean square feedback is used:

Hybrid feedback=0.25(zero forcing feedback)+0.75 (least mean square feedback).

The resulting hybrid feedback product is converted to an analog signal (block 465). This may be done, for example, by providing the hybrid feedback product that is a series of digital values to a digital to analog converter. The digital analog converter constructs an analog signal based upon the series of digital values. The resulting analog signal is provided as a feedback controlling the gain of the variable amplification process (block 410) and is used in processing subsequent analog input signals.

Figure 5:
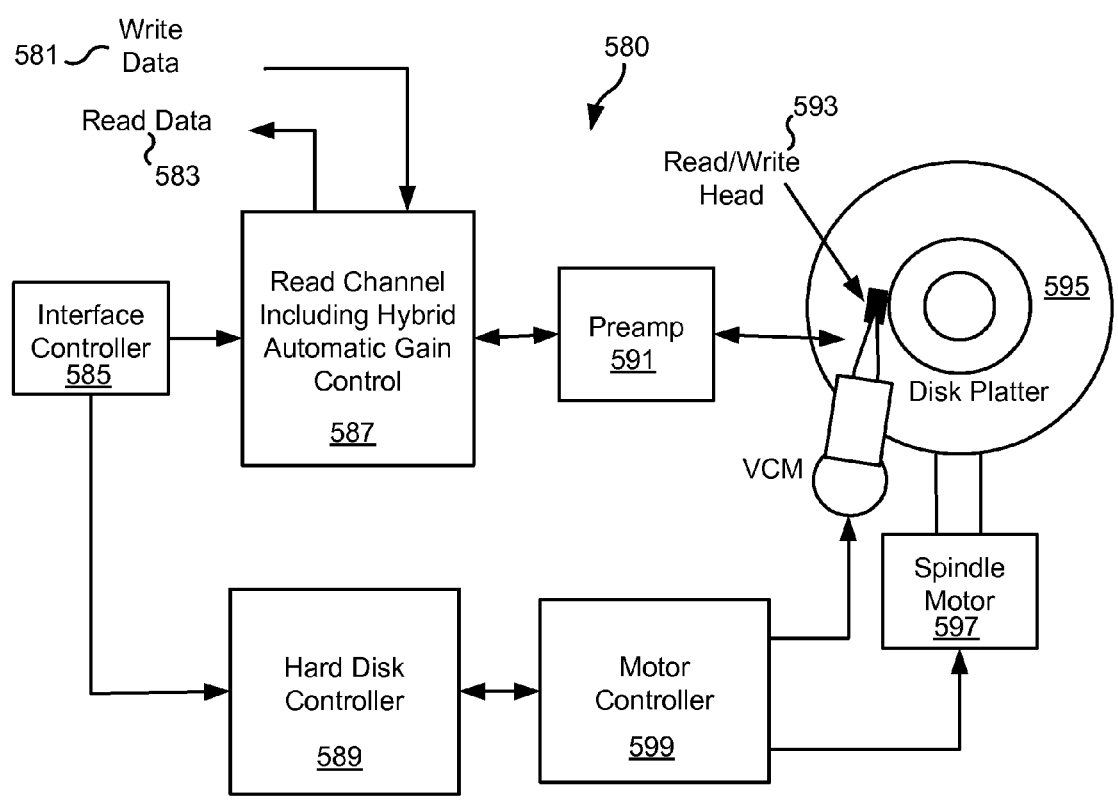
FIG. 5 depicts a storage device including a read channel circuit utilizing a hybrid automatic gain control loop in accordance with various embodiments of the present invention.

Turning to FIG. 5, a storage device 580 including a read channel circuit utilizing a hybrid automatic gain control loop is depicted in accordance with various embodiments of the present invention. Storage device 580 may be, for example, a hard disk drive. Storage device 580 includes a read channel circuit 587 that incorporates a hybrid automatic gain control circuit capable of providing reasonably optimal gain control for across a wide variety of input signals and energy distributions. The hybrid automatic gain control circuit may include components similar to those described above in relation to FIG. 3 and operate in accordance with that described above in relation to flow diagram of FIG. 4.

In addition, storage device 580 includes an interface controller 585, a hard disk controller 589, a motor controller 599, and a spindle motor 597. Interface controller 585 controls addressing and timing of data to/from disk platter 595. The data on disk platter 595 consists of groups of magnetic signals that may be detected by read/write head assembly 593 when the assembly is properly positioned over disk platter 595. The data signals are typically arranged in sectors and tracks as is known in the art. In a typical read operation, read/write head assembly 593 is accurately positioned by motor controller 599 over a desired data track on disk platter 595. Motor controller 599 both positions read/write head assembly 593 in relation to disk platter 595 and drives spindle motor 597 by moving read/write head assembly to the proper data track on disk platter 595 under the direction of hard disk controller 589. Spindle motor 597 spins disk platter 595 at a determined spin rate (RPMs).

Once read/write head assembly 593 is positioned adjacent the proper data track, magnetic signals representing data on disk platter 595 are sensed by read/write head assembly 593 as disk platter 595 is rotated by spindle motor 597. The sensed magnetic signals are provided as a continuous, minute analog signal representative of the magnetic data on disk platter 595. This minute analog signal is transferred from read/write head assembly 593 to read channel module 587. Read channel module 587 receives the analog signal representing the data from disk platter 595 and performs an automatic gain adjustment on the signal. The automatic gain adjustment is done using a hybrid automatic gain control circuit. The automatic gain control is done in relation to a data detection process. The data detection process is directed at retrieving the original data, and the finally detected data is used as feedback in the gain control loop. A write operation is substantially the opposite of the preceding read operation with write data 581 being provided to read channel module 587. This data is then encoded and written to disk platter 595.

In conclusion, the invention provides novel systems, devices, methods and arrangements for providing automatic gain control. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A variable gain circuit, the circuit comprising:
   a zero forcing loop generating a zero forcing feedback;
   a least mean square loop generating a least mean square feedback; and
   an error quantization circuit, wherein the error quantization circuit generates a hybrid feedback based upon a threshold condition using the zero forcing feedback and the least mean square feedback.

2. The circuit of claim 1, wherein the circuit further comprises:
   a variable gain amplifier, and wherein a gain of the variable gain amplifier is at least in part controlled by a derivative of the hybrid feedback.

3. The circuit of claim 2, wherein the zero forcing loop includes:
   an analog to digital converter providing a series of digital samples based upon an output of the variable gain amplifier;
   an equalizer circuit equalizing the series of digital samples and providing an equalized output;
   a data detector circuit operable to perform a data detection process on the equalized output and to provide a detected output;
   a convolution circuit operable to reconstruct the equalized output based upon the detected output and to provide a convolved output;
   an adder circuit subtracting the convolved output from a derivative of the equalized output to create an error signal; and
   a multiplier circuit multiplying the error signal by the convolved output create the zero forcing feedback.

4. The circuit of claim 2, wherein the least mean square loop includes:
   an analog to digital converter providing a series of digital samples based upon an output of the variable gain amplifier;
   an equalizer circuit equalizing the series of digital samples and providing an equalized output;
   a data detector circuit operable to perform a data detection process on the equalized output and to provide a detected output;
   a convolution circuit operable to reconstruct the equalized output based upon the detected output and to provide a convolved output;
   an adder circuit subtracting the convolved output from a derivative of the equalized output to create an error signal; and
   a multiplier circuit multiplying the error signal by a derivative of the series of digital samples to create the least mean square feedback.

5. The circuit of claim 4, wherein the derivative of the equalized output is a delayed version of the equalized output.

6. The circuit of claim 4, wherein the derivative of the series of digital samples is a delayed version of the series of digital samples.

7. The circuit of claim 1, wherein the threshold condition is a single energy threshold, and wherein:
   when an energy level exceeds the single energy threshold, the error quantization circuit provides the least mean square feedback is selected as the hybrid feedback; and
   when the energy level is less than the single energy threshold, the error quantization circuit provides the zero forcing feedback is selected as the hybrid feedback.

8. The circuit of claim 7, wherein the derivative of the equalized output is a delayed version of the equalized output.

9. The circuit of claim 7, wherein the derivative of the series of digital samples is a delayed version of the series of digital samples.

10. The circuit of claim 1, wherein the threshold condition exhibits a first energy threshold and a second energy threshold, and wherein:
    when an energy level exceeds the first energy threshold, the error quantization circuit provides the least mean square feedback is selected as the hybrid feedback;
    when the energy level is less than the second energy threshold, the error quantization circuit provides the zero forcing feedback is selected as the hybrid feedback; and
    when the energy level is between the first energy threshold and the second energy threshold, the error quantization circuit provides a combination of the zero forcing feedback and the least mean square feedback as the hybrid feedback.

11. The circuit of claim 10, wherein the combination of the zero forcing feedback and the least mean square feedback is a first combination of the zero forcing feedback and the least mean square feedback, wherein the threshold condition further exhibits a third energy threshold between the first energy threshold and the second energy threshold, and wherein:
    when an energy level is between the first energy threshold and the third energy threshold, the error quantization circuit provides the first combination of the zero forcing feedback and the least mean square feedback as the hybrid feedback; and
    when the energy level is between the third energy threshold and the second energy threshold, the error quantization circuit provides a second combination of the zero forcing feedback and the least mean square feedback as the hybrid feedback.

12. The circuit of claim 11, wherein the threshold condition further exhibits a fourth energy threshold between the first energy threshold and the third energy threshold, and wherein:
    when an energy level is between the first energy threshold and the fourth energy threshold, the error quantization circuit provides the first combination of the zero forcing feedback and the least mean square feedback as the hybrid feedback; and
    when the energy level is between the fourth energy threshold and the third energy threshold, the error quantization circuit provides a third combination of the zero forcing feedback and the least mean square feedback as the hybrid feedback.

13. The circuit of claim 12, wherein:
the first combination of the zero forcing feedback and the least mean square feedback is calculated in accordance with the following equation:

0.75(zero forcing feedback)+0.25(least mean square feedback);

the second combination of the zero forcing feedback and the least mean square feedback is calculated in accordance with the following equation:

0.25(zero forcing feedback)+0.75(least mean square feedback); and the third combination of the zero forcing feedback and the least mean square feedback is calculated in accordance with the following equation:

0.50(zero forcing feedback)+0.50(least mean square feedback).

14. A method for performing automatic gain control, the method comprising:
performing a variable gain amplification on an input signal to provide a gain adjusted input signal;
performing a zero forcing feedback on the gain adjusted input signal to create a zero forcing feedback;
performing a least mean square feedback on the gain adjusted signal to create a least mean square feedback;
determining an energy level associated with the zero forcing feedback and the least mean square feedback;
generating a hybrid feedback based upon a threshold condition using the zero forcing feedback and the least mean square feedback; and
modifying a gain of the variable gain amplification based on the hybrid feedback.

15. The method of claim 14, wherein the threshold condition exhibits a first energy threshold and a second energy threshold, and wherein:
when an energy level exceeds the first energy threshold, the hybrid feedback is the same as the least mean square feedback;
when the energy level is less than the second energy threshold, the hybrid feedback is the same as the zero forcing feedback; and
when the energy level is between the first energy threshold and the second energy threshold, the hybrid feedback is a combination of the zero forcing feedback and the least mean square feedback as the hybrid feedback.

16. The method of claim 15, wherein the combination of the zero forcing feedback and the least mean square feedback is a first combination of the zero forcing feedback and the least mean square feedback, wherein the threshold condition further exhibits a third energy threshold between the first energy threshold and the second energy threshold, and wherein:
when an energy level is between the first energy threshold and the third energy threshold, the hybrid feedback is the first combination of the zero forcing feedback and the least mean square feedback as the hybrid feedback; and
when the energy level is between the third energy threshold and the second energy threshold, the hybrid feedback is a second combination of the zero forcing feedback and the least mean square feedback as the hybrid feedback, wherein the second combination of the zero forcing feedback and the least mean square feedback is distinct from the first combination of the zero forcing feedback and the least mean square feedback.

17. The method of claim 16, wherein the threshold condition further exhibits a fourth energy threshold between the first energy threshold and the third energy threshold, and wherein:

when an energy level is between the first energy threshold and the fourth energy threshold, the hybrid feedback is the first combination of the zero forcing feedback and the least mean square feedback as the hybrid feedback; and when the energy level is between the fourth energy threshold and the third energy threshold, the hybrid feedback is a third combination of the zero forcing feedback and the least mean square feedback as the hybrid feedback, and wherein the third combination of the zero forcing feedback and the least mean square feedback is distinct from the first combination of the zero forcing feedback and the least mean square feedback.

18. A storage device, wherein the storage device comprises:
a magnetic storage medium including magnetically recorded information;
a variable gain amplifier receiving an analog input signal representing the magnetically recorded information and providing a gain adjusted output;
an analog to digital converter providing a series of digital samples corresponding to the gain adjusted output;
a zero forcing loop generating a zero forcing feedback;
a least mean square loop generating a least mean square feedback; and
an error quantization circuit, wherein the error quantization circuit generates a hybrid feedback based upon a threshold condition using the zero forcing feedback and the least mean square feedback, and wherein a derivative of the hybrid feedback controls a gain of the variable gain amplifier.

19. The storage device of claim 18, wherein the threshold condition exhibits a first energy threshold, a second energy threshold, a third energy threshold and a fourth energy threshold, and wherein:

when an energy level exceeds the first energy threshold, the error quantization circuit provides the least mean square feedback is selected as the hybrid feedback;

when the energy level is between the first energy threshold and the second energy threshold, the error quantization circuit provides a first combination of the zero forcing feedback and the least mean square feedback as the hybrid feedback;

when the energy level is between the second energy threshold and the third energy threshold, the error quantization circuit provides a second combination of the zero forcing feedback and the least mean square feedback as the hybrid feedback;

when the energy level is between the third energy threshold and the fourth energy threshold, the error quantization circuit provides a third combination of the zero forcing feedback and the least mean square feedback as the hybrid feedback; and when the energy level is less than the fourth energy threshold, the error quantization circuit provides the zero forcing feedback is selected as the hybrid feedback.

20. The storage device of claim 19, wherein:

the first combination of the zero forcing feedback and the least mean square feedback is calculated in accordance with the following equation:

0.75(zero forcing feedback)+0.25(least mean square feedback);

the second combination of the zero forcing feedback and the least mean square feedback is calculated in accordance with the following equation:

0.50(zero forcing feedback)+0.50(least mean square feedback); and the third combination of the zero forcing feedback and the least mean square feedback is calculated in accordance with the following equation:

0.25(zero forcing feedback)+0.75(least mean square feedback).

* * * * *